United States Patent
Arakawa et al.

(10) Patent No.: US 12,204,244 B2
(45) Date of Patent: Jan. 21, 2025

(54) IMPRINT APPARATUS AND ARTICLE MANUFACTURING METHOD

(71) Applicant: CANON KABUSHIKI KAISHA, Tokyo (JP)

(72) Inventors: Tatsuya Arakawa, Kanagawa (JP); Kenichi Kobayashi, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/874,587

(22) Filed: Jul. 27, 2022

(65) Prior Publication Data
US 2023/0061381 A1      Mar. 2, 2023

(30) Foreign Application Priority Data

Aug. 24, 2021 (JP) ................................. 2021-136374
May 23, 2022 (JP) ................................. 2022-083627

(51) Int. Cl.
    *G03F 7/00*      (2006.01)

(52) U.S. Cl.
    CPC ................................. *G03F 7/0002* (2013.01)

(58) Field of Classification Search
    CPC .................................................. G03F 7/0002
    See application file for complete search history.

(56) References Cited

U.S. PATENT DOCUMENTS

| | | | |
|---|---|---|---|
| 2013/0093113 A1* | 4/2013 | Hayashi | B29C 43/021 |
| | | | 264/293 |
| 2017/0057153 A1* | 3/2017 | Tanaka | G03F 7/0002 |

FOREIGN PATENT DOCUMENTS

JP      2019009226 A      1/2019

* cited by examiner

*Primary Examiner* — Larry W Thrower
*Assistant Examiner* — John W Hatch
(74) *Attorney, Agent, or Firm* — ROSSI, KIMMS & McDOWELL LLP (57) ABSTRACT

The imprint apparatus according to the present invention for forming a pattern by curing a resin in a state in which a pattern region in a mold is brought into contact with the resin on a shot region in a substrate, includes an element configured to adjust an irradiation region of light from a light source with which the substrate is irradiated, a measurement unit configured to measure a position of a mark formed in the mold, and a controller configured to control a position of the irradiation region with respect to the position of the mark in a plane parallel to a surface of the substrate, based on a measurement result of the position of the mark by the measurement unit.

16 Claims, 6 Drawing Sheets

IMPRINT APPARATUS AND ARTICLE MANUFACTURING METHOD

BACKGROUND OF THE INVENTION

Field of the Invention

The present invention is related to an imprint apparatus.

Description of the Related Art

Conventionally, an imprint apparatus for transferring a pattern formed on a mold onto a substrate by curing a resin with bringing the pattern into contact with the resin on the substrate is known as one of lithography apparatuses for manufacturing articles such as semiconductor devices and liquid crystal display apparatuses.

In such an imprint apparatus, it is known that when the shape of a pattern region on a mold on which a pattern is formed is different from the shape of a shot region on a substrate to which the pattern is transferred, the transfer accuracy of the pattern decreases.

In order to suppress such a decrease in pattern transfer accuracy, a method is known in which a shot region on a substrate is deformed by being irradiated with light and heated to make the shape of the shot region on the substrate coincide with the shape of the pattern region on the mold.

However, when the shot region is irradiated with light, if the irradiation region of light is not formed at the target position because the coordinate system regarding light deviates from the coordinate system regarding the substrate and the mold, it is difficult to appropriately deform the shot region on the substrate.

Japanese Patent Application Laid-open No. 2019-009226 discloses an imprint apparatus for adjusting the position of the irradiation region of light by curing a part of resin on a shot region of a substrate corresponding to the irradiation region of light and then measuring respective positions of the cured part of resin and a mark formed on a mold.

In the imprint apparatus disclosed in Japanese Patent Application Laid-open No. 2019-009226, since the respective positions of the cured part of resin and the mark formed on the mold are measured after the part of resin is cured, a throughput decreases by time required for the curing.

Further, in the case where the shot region on the substrate is deformed by being irradiated with light and heated as described above before curing the resin, it is difficult to use a method of adjusting the position of the irradiation region of light by measuring the position of the cured resin as in the imprint apparatus of Japanese Patent Application Laid-open No. 2019-009226.

SUMMARY OF THE INVENTION

An object of the present invention is to provide an imprint apparatus capable of adjusting the position of an irradiation region of light with which a substrate is irradiated with suppressing a decrease in throughput.

An imprint apparatus according to the present invention for forming a pattern by curing a resin in a state in which a pattern region in a mold is brought into contact with the resin on a shot region in a substrate includes an element for adjusting an irradiation region of light from a light source with which the substrate is irradiated, a measurement unit for measuring a position of a mark formed in the mold, and a controller for controlling a position of the irradiation region with respect to the position of the mark in a plane parallel to a surface of the substrate based on a measurement result of the position of the mark by the measurement unit.

Further features of the present invention will become apparent from the following description of exemplary embodiments with reference to the attached drawings.

DESCRIPTION OF THE EMBODIMENTS

Hereinafter, an imprint apparatus according to the present invention will be described in detail with reference to the accompanying drawings. It should be noted that the figures shown below are illustrated on a scale different from the actual scale in order to facilitate understanding of the present invention.

Further, in the following description, a direction parallel to an optical axis of an illumination system that irradiates a resin on a substrate with curing light is defined as a Z direction, and two directions perpendicular to each other in a plane perpendicular to the Z direction are defined to as an X direction and a Y direction.

First Embodiment

Figure 1A:
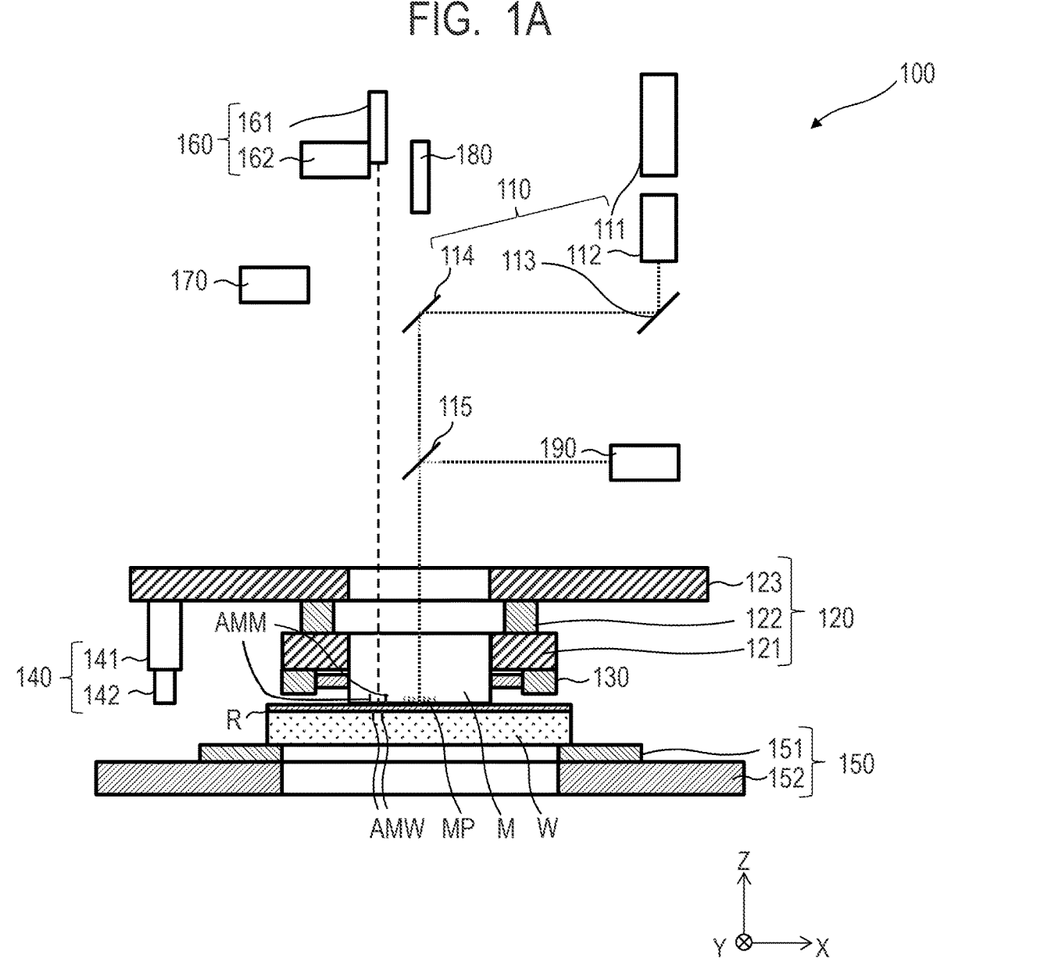
FIG. 1A is a schematic cross-sectional view of an imprint apparatus according to a first embodiment of the present invention.

FIG. 1A shows a schematic cross-sectional view of the imprint apparatus 100 according to a first embodiment of the present invention.

Figure 1B:
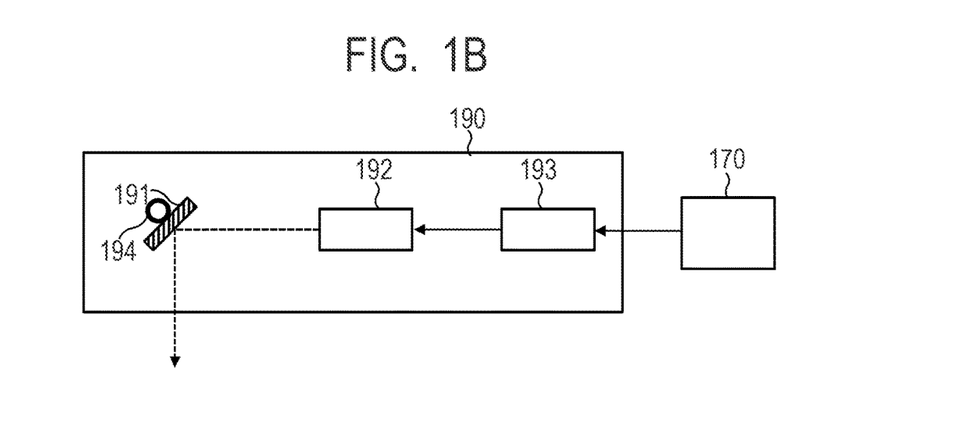
FIG. 1B is a partially enlarged schematic cross-sectional view of the imprint apparatus according to the first embodiment.

Further, FIG. 1B shows a schematic cross-sectional view of the light supplying unit 190 provided in the imprint apparatus 100 according to the first embodiment.

As the imprint apparatus 100 according to the present embodiment, an imprint apparatus using a photo-curing method, specifically, an ultraviolet-curing imprint apparatus for curing an uncured imprint material on a substrate by being irradiated with ultraviolet light is used as an example.

However, the imprint apparatus 100 according to the present embodiment is not limited thereto, and may cure the uncured imprint material on the substrate by using an electromagnetic wave in a wavelength band other than ultraviolet, or using energy other than an electromagnetic wave, such as heat.

The imprint apparatus 100 according to the present embodiment includes a curing unit 110, a half mirror 115, a mold holding unit 120, a mold deforming unit 130, a dispenser 140, a substrate holding unit 150, a measurement unit 160, a controller 170, a scope 180, and a light supplying unit 190.

The imprint apparatus 100 according to the present embodiment forms a pattern in each of a plurality of shot regions S on the substrate W by repeating an imprint cycle in the above-described structure.

Here, the imprint cycle is a cycle in which a pattern is formed in the predetermined shot region S by curing the imprint material R in a state in which the pattern region of the mold M is brought into contact with the imprint material R on the predetermined shot region S formed on the substrate surface (a surface) of the substrate W.

As the imprint material R, an ultraviolet curing resin is used in the imprint apparatus 100 according to the present embodiment.

The curing unit 110 includes a light source 111, an optical system 112, a setting unit 113, and a half mirror 114, for example, and cures the imprint material R by irradiating the imprint material R on the predetermined shot region S of the substrate W with light via the mold M.

The light source 111 includes a light source such as a halogen lamp for generating irradiation light including ultraviolet rays such as an i-line and a g-line, and an elliptical mirror for collecting the irradiation light emitted from the light source.

The optical system 112 includes a lens for irradiating the predetermined shot region S (pattern formation region) on the substrate W with the irradiation light for curing the imprint material R.

The optical system 112 may include an optical integrator for uniformly illuminating the substrate W (and the mold M).

The setting unit 113 includes an aperture and an adjustable field stop used for angle-of-view control and outer periphery light shielding control, for example.

Specifically, the setting unit 113 can illuminate only the predetermined shot region S by performing the angle-of-view control, and can restrict the irradiation light from exceeding the predetermined shot region S such that other shot regions S are irradiated with the irradiation light by performing the outer periphery light shielding control.

That is, the curing unit 110 can illuminate a desired shot region S on the substrate W by using the setting unit 113.

The half mirror 114 changes an optical path of the irradiation light from the setting unit 113 to a direction toward the substrate W.

Thereby, light whose irradiation region of the energy (that is, the irradiation light) is determined by the setting unit 113 is incident on the imprint material R on the predetermined shot region S of the substrate W via an imaging system (not shown) and the mold M.

The mold holding unit 120 includes a mold chuck 121, a driving unit 122, and a base 123 for supporting the driving unit 122, for example.

The mold chuck 121 sucks the mold M to hold by using a vacuum suction force or an electrostatic force, for example.

The driving unit 122 drives the mold chuck 121 to move the mold M, thereby controlling positions of the mold M with respect to six axes, bringing the mold M into contact with the imprint material R on the predetermined shot region S of the substrate W, and separating (releasing) the mold M from the cured imprint material R.

Here, the six axes include an X axis, a Y axis, and a Z axis in an XYZ coordinate system, and rotation axes about the X axis, the Y axis, and the Z axis.

The mold M has a rectangular outer peripheral portion, for example, has a predetermined concave-convex pattern MP (a pattern) three-dimensionally formed on a pattern surface facing the substrate W, and is made of a material to transmit ultraviolet rays, such as quartz or the like.

As will be described later, an alignment marks AMM (a mark) is formed on the mold M, and the mold M can be conveyed by a mold conveying apparatus (not shown).

The mold conveying apparatus includes a conveying robot having a chuck, such as a vacuum chuck.

The mold deforming unit 130 is mounted on the mold chuck 121, for example, and can deform the mold M by applying pressure to the mold M from the outer peripheral direction using a cylinder (an actuator) operated by fluid, such as air or oil.

The mold M may be deformed by providing a temperature controller to control temperature of the mold M in the mold deforming unit 130.

Since the substrate W can be deformed (typically, expanded or contracted) by undergoing a process, such as heat treatment, the mold deforming unit 130 corrects a shape of the mold M such that respective positions of the substrate W and the mold M coincide with each other in accordance with such deformation of the substrate W.

Further, the imprint apparatus 100 according to the present embodiment may include a temperature controller for controlling temperature of the substrate W to intentionally deform the substrate W by the temperature control.

The dispenser 140 includes a tank 141 for storing the imprint material R, and a nozzle 142 (a discharging port) for discharging the imprint material R supplied from the tank 141 via a supply path to the substrate W, for example.

Further, the dispenser 140 includes a valve (not shown) provided in the supply path of the imprint material R, and a supply amount controller (not shown).

Note that the dispenser 140 may apply (supply) the imprint material R to a plurality of shot regions S on the substrate W collectively before performing an imprint cycle, or may apply the imprint material R to a predetermined shot region S when performing the imprint cycle thereon.

Further, the imprint material R may be applied to an entire surface of the substrate W in an external apparatus (an application apparatus) without providing the dispenser 140 in the imprint apparatus 100 according to the present embodiment.

In the dispenser 140, the supply amount controller controls the valve to control a supply amount of the imprint material R to the substrate W.

As described above, a curable composition cured by being given energy for curing is used as the imprint material R.

Here, an electromagnetic wave, heat or the like is used as the energy for curing, and light such as an infrared ray, a visible ray, an ultraviolet ray or the like having a wavelength selected from a range of 10 nm or more and 1 mm or less is used as the electromagnetic wave.

In particular, when a resin is used as the imprint material R, an ultraviolet ray having a wavelength between 100 nm and 400 nm is often used as an electromagnetic wave for curing the resin.

As described above, the curable composition used as the imprint material R is a composition cured by a light irradiation or heating.

A photocurable composition cured by the light irradiation among such curable compositions contains at least a polymerizable compound and a photopolymerization initiator, and may contain a non-polymerizable compound or a solvent as necessary.

Here, the non-polymerizable compound is at least one selected from a group consisting of a sensitizer, a hydrogen donor, an internal mold release agent, a surfactant, an antioxidant, a polymer component or the like.

A viscosity of the imprint material R (specifically, a viscosity at 25° C.) is 1 mPa·s or more and 100 mPa·s or less, for example.

The substrate holding unit 150 includes a substrate chuck 151, a substrate stage 152 and a driving mechanism (not shown).

The substrate chuck 151 sucks the substrate W to hold by a vacuum suction pad or the like, for example.

The substrate stage 152 moves the substrate W with respect to six axes by being driven using the driving mechanism (not shown) with holding the substrate chuck 151 to perform an alignment between the substrate W and the mold M.

Glass, ceramics, metal, semiconductor, resin or the like is used as a material of the substrate W, and the substrate W can be conveyed by a substrate conveying apparatus (not shown).

If necessary, a member made of a material different from that of the substrate W may be formed on a surface of the substrate W.

Specifically, a silicon wafer, a compound semiconductor wafer, quartz glass or the like is used as the substrate W, for example.

The measurement unit 160 includes an alignment scope 161 and an alignment stage 162.

The alignment scope 161 includes an automatic adjustment scope (AAS) used to align the mold M and a predetermined shot region S on the substrate W with each other.

Specifically, the alignment scope 161 detects an alignment mark AMM formed in the mold M and an alignment mark AMW formed in the predetermined shot region S on the substrate W via the mold M.

The alignment stage 162 performs positioning for the measurement of the alignment scope 161.

The controller 170 includes a CPU, a memory (a storage unit) and the like, and can control the entire imprint apparatus 100 according to the present embodiment, namely each component connected by wires (not shown).

The scope 180 is an imaging unit for observing the entire predetermined shot region S on the substrate W, and confirms an imprint state, and a progress state of pressing of the mold and filling of the imprint material R.

The light supplying unit 190 includes, a structure as shown in FIG. 1B, for example, namely a spatial light modulating element 191 (a spatial modulating element, an element, an optical element), a light source 192, a light source controller 193 and an actuator 194.

That is, the light supplying unit 190 can modulate irradiation light from the light source 192 into an arbitrary shape, namely, can form a light irradiation region L described below by using an optical system including the spatial light modulating element 191.

As the spatial light modulating element 191, a digital micromirror device (DMD) is often used.

However, the present invention is not limited thereto, and an element other than the DMD, such as a liquid crystal display element (LCD) may be used as long as an element can irradiate an imprint region with light to form an illuminance distribution (the light irradiation region L).

A shape of the spatial light modulating element 191 can be freely changed within a range of resolution.

The light source controller 193 is configured to control the light source 192, and is controlled by the controller 170.

The actuator 194 is configured to control a position of the spatial light modulating element 191, and control axes of the actuator 194 are preferably three or more axes, but may be two or less axes.

The light emitted from the light supplying unit 190 passes through the mold M after reflected by the half mirror 115, thereby a predetermined shot region S on the substrate W is irradiated with the light.

Further, the imprint apparatus 100 according to the present embodiment includes a platen for holding the mold holding unit 120 and a vibration isolator (a damper) (not shown).

The platen supports the entire imprint apparatus 100 according to the present embodiment and forms a reference plane when the substrate stage 152 moves.

The vibration isolator supports the platen by removing vibration from a floor.

Figure 2:
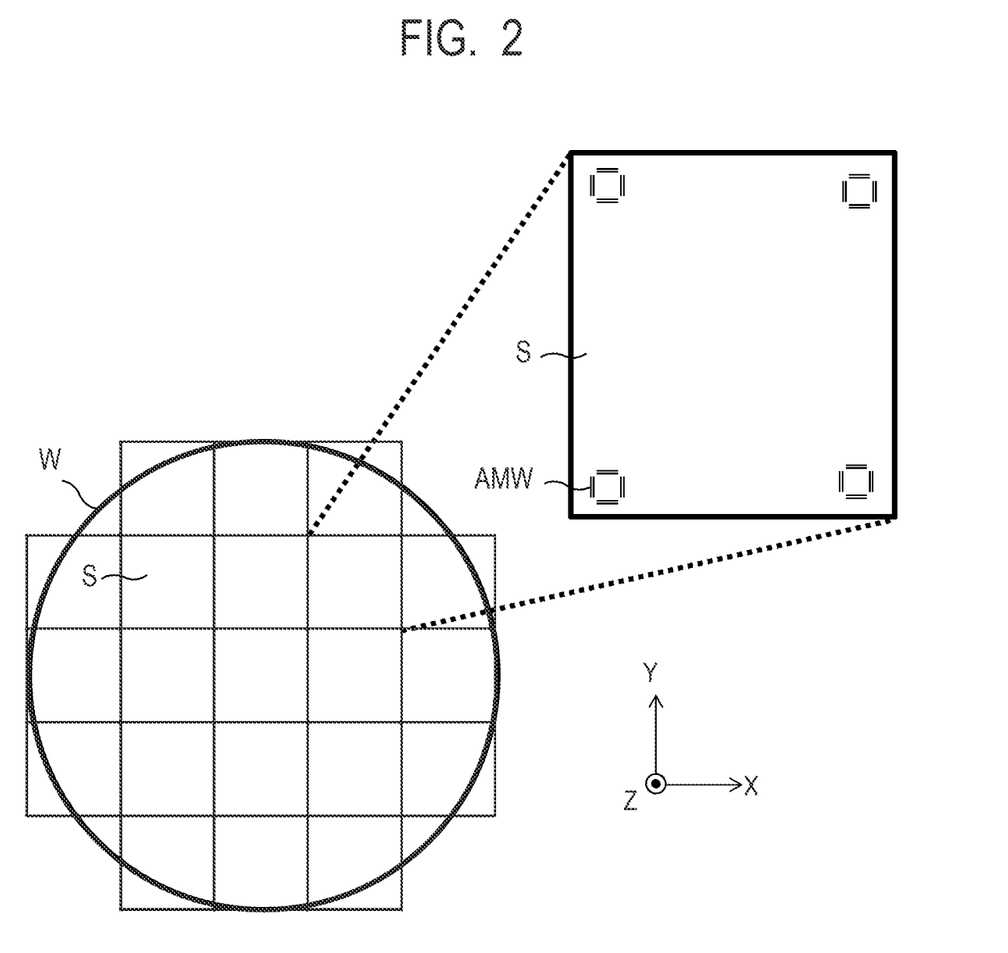
FIG. 2 is a top view of a substrate used in the imprint apparatus according to the first embodiment.

FIG. 2 is a top view showing an example of the substrate W used in the imprint apparatus 100 according to the present embodiment.

The substrate W includes a single-crystal silicon substrate or an SOI (Silicon on Insulator) substrate or the like, for example, and a concave-convex pattern MP formed on the mold M is transferred to the substrate W.

Specifically, as shown in FIG. 2, a plurality of shot regions S are formed on the substrate W, a plurality of alignment marks AMW are formed in each shot region S, and the concave-convex pattern MP is transferred to each shot region S.

In the following description, it is assumed that at least one pattern layer has already been formed in each shot region S on the substrate W.

Figure 3:
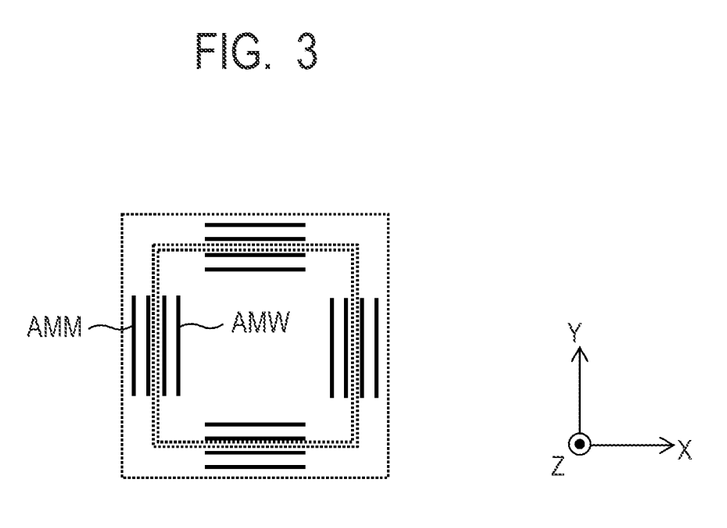
FIG. 3 is a view showing an alignment mark detected in the imprint apparatus according to the first embodiment.

FIG. 3 is a diagram showing an example of alignment marks AMN and AMW detected by the measurement unit 160 in the imprint apparatus 100 according to the present embodiment.

As shown in FIG. 3, the alignment mark AMM on the mold M and the alignment mark AMW on the predetermined shot region S of the substrate W are formed so as not to overlap each other when an alignment described later is performed.

Then, the alignment scope 161 provided in the measurement unit 160 detects the alignment mark AMW on the predetermined shot region S of the substrate W through the alignment mark AMM on the mold M.

Thereby, a relative position between the alignment mark AMM and the alignment mark AMW can be measured.

In the imprint apparatus 100 according to the present embodiment, the alignment between the alignment marks AMM and AMW is performed by a die-by-die alignment method.

Further, the measurement unit 160 can measure respective positions of the alignment marks AMW and AMM independently.

Figure 4A:
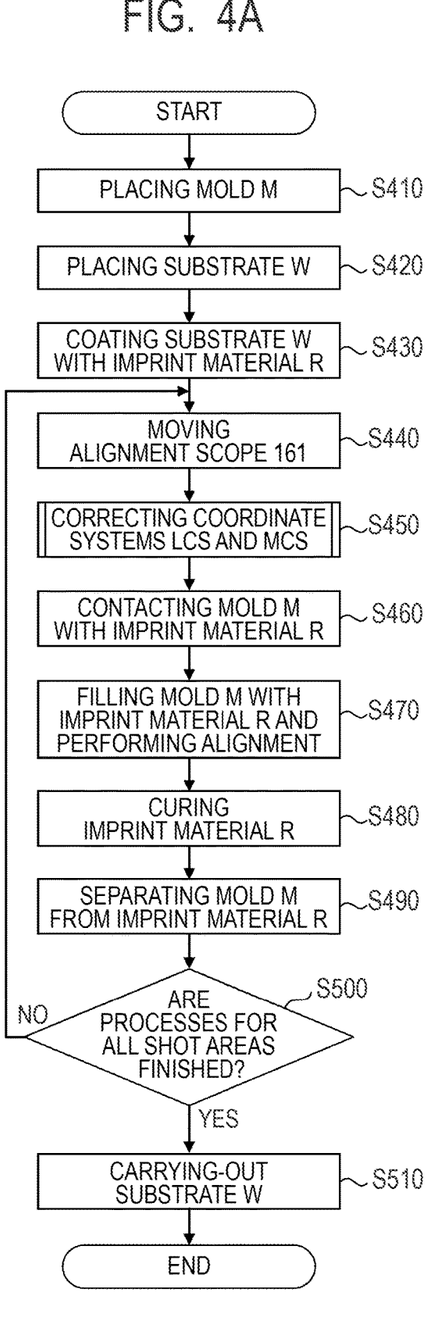
FIG. 4A is a flowchart showing an imprint process performed by the imprint apparatus according to the first embodiment.

FIG. 4A is a flowchart illustrating an imprint process performed by the imprint apparatus 100 according to the present embodiment.

Figure 4B:
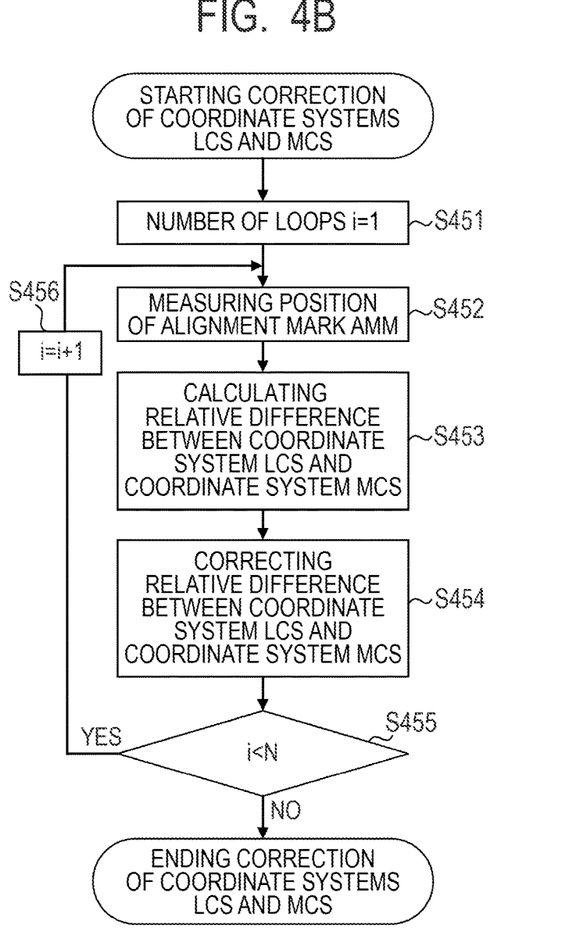
FIG. 4B is a flowchart showing the imprint process performed by the imprint apparatus according to the first embodiment.

Further, FIG. 4B is a flowchart showing a process in step S450 which is one step in the imprint process.

Note that the imprint process is executed mainly by a control of each unit by the controller 170.

First, in step S410, the mold M is conveyed to the mold chuck 121 by a mold conveying apparatus (not shown) and positioned, and then the positioned mold M is held by the mold chuck 121.

Next, in step S420, the substrate W is conveyed to the substrate chuck 151 by a substrate conveying apparatus (not shown), and then held by the substrate chuck 151.

In step S430, the imprint material R is applied to an entire substrate surface of the substrate W by the dispenser 140.

As described above, step S430 is omitted in a case where the imprint material R is applied onto the substrate W by an external apparatus without using the dispenser 140 provided in the imprint apparatus 100 according to the present embodiment.

In step S440, the alignment stage 162 moves the alignment scope 161 to a position at which the alignment mark AMM on the mold M is measured.

That is, the alignment stage 162 performs positioning so as to fix the alignment scope 161 to an absolute coordinate system (ACS) in the imprint apparatus 100 according to the present embodiment.

In step S450, a position of a light irradiation region L from the spatial light modulating element 191 in the light supplying unit 190 is corrected with respect to the position of the mold M.

Specifically, in step S450, the light irradiation region L from the spatial light modulating element 191 in the light supplying unit 190 is controlled based on the measurement result of the position of the alignment mark AMM by the alignment scope 161.

More specifically in the step S450, a deviation between a coordinate system LCS (Light Coordinate System) regarding the light irradiation region L in the spatial light modulating element 191 and a coordinate system MCS (Mask Coordinate System) regarding the mold M is corrected.

That is, in step S450, the deviation between both coordinate systems is corrected by performing a predetermined correction on at least one of the coordinate systems LCS and MCS.

For example, it is possible to control viscosity of the imprint material R when the mold M and the substrate W are brought into contact with each other, and to suppress diffusion of the imprint material R on a predetermined shot region S to other shot regions S by the light irradiation from the light supplying unit 190.

Further, the substrate W can be deformed into a desired shape or size by the light irradiation from the light supplying unit 190 to heat the substrate W.

Therefore, it is preferred that the light supplied from the light supplying unit 190 is light having a wavelength at which a resin as the imprint material R is not photosensitive (not cured), such as light having a wavelength in a range between 400 nm and 2000 nm.

In particular, it is more preferred that the light supplied from the light supplying unit 190 is light having a wavelength in a range between 500 nm and 800 nm from a viewpoint of heating effectiveness.

Further, the light supplied from the light supplying unit 190 is not limited to the above-described wavelength range, and may be an ultraviolet ray having a wavelength in a range in which the photosensitivity is relatively weak among ultraviolet rays having a wavelength in a range between 200 nm and 400 nm at which a resin is photosensitive, for example.

When the substrate W is irradiated with the irradiation light, if the mold M has an arrangement error or the like, the imprint material R on the shot region S to be irradiated may not be cured.

The above-described concern causes various troubles, such as an inhibition of filling of the imprint material R, a poor diffusion of the imprint material R, poor heat input to the substrate W or the like.

As shown in FIG. 4B, the step S450 includes steps S451 to S456.

In step S451, 1 is substituted for a variable i indicating the number of loops in the step S450.

In step S452, the measurement unit 160 measures the position of the alignment mark AMM.

In step S453, a relative difference between the coordinate system MCS and the coordinate system LCS is calculated based on the measurement result of the position of the alignment mark AMM in the step S452.

Then, in step S454, the relative difference between the coordinate system MCS and the coordinate system LCS calculated in the step S453 is corrected.

In the imprint apparatus 100 according to the present embodiment, the correction method in the step S454 can be selected from the following three methods A, B and C:

A: Adjustment of the position of the spatial light modulating element 191,

B: Adjustment of the light irradiation region L by the spatial light modulating element 191, and C: Adjustment of the position of type M.

However, the method is not limited to the above-described methods A to C, and other methods may be selected.

Figure 5A:
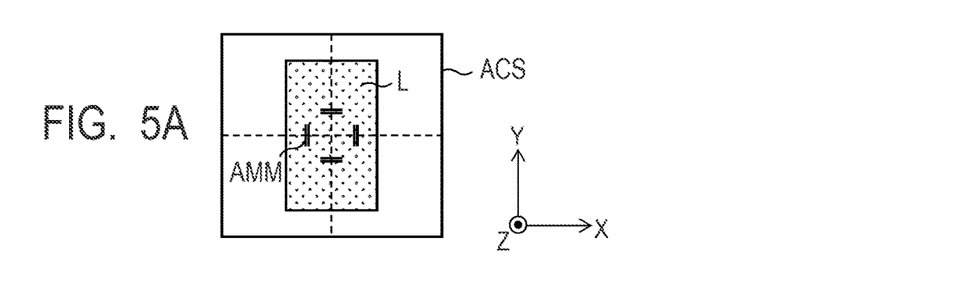
FIG. 5A is a diagram showing respective coordinate systems in the imprint apparatus according to the first embodiment.

FIG. 5A shows an arrangement of respective coordinate systems in an ideal state of the imprint apparatus 100 according to the present embodiment.

Specifically, in FIG. 5A, the alignment mark AMM and the light irradiation region L are shown as respective representative points of the coordinate system MCS and the coordinate system LCS, with the absolute coordinate system ACS of the imprint apparatus 100 according to the present embodiment as a reference.

That is, in the ideal state of the imprint apparatus 100 according to the present embodiment, respective origins of the alignment mark AMM and the light irradiation region L coincide with the 0 point of the absolute coordinate system ACS, and each of the alignment mark AMM and the light irradiation region L has no inclination.

Figure 5B:
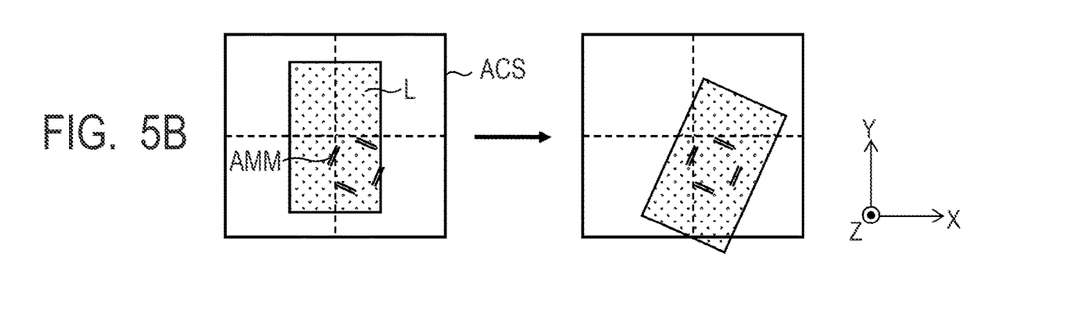
FIG. 5B is a diagram showing respective coordinate systems in the imprint apparatus according to the first embodiment.
Figure 5C:
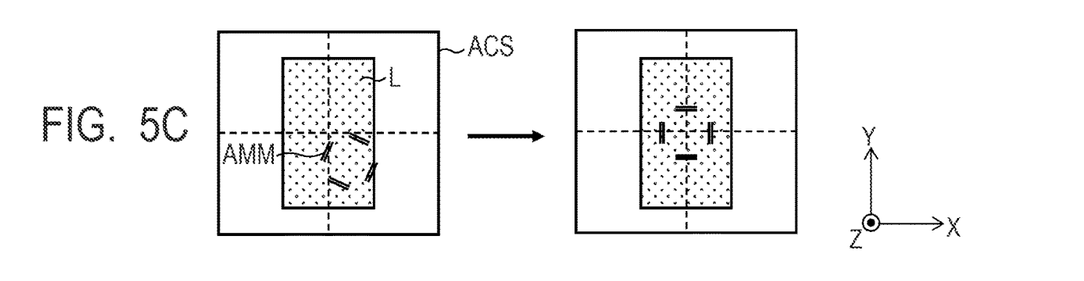
FIG. 5C is a diagram showing respective coordinate systems in the imprint apparatus according to the first embodiment.
Figure 5D:
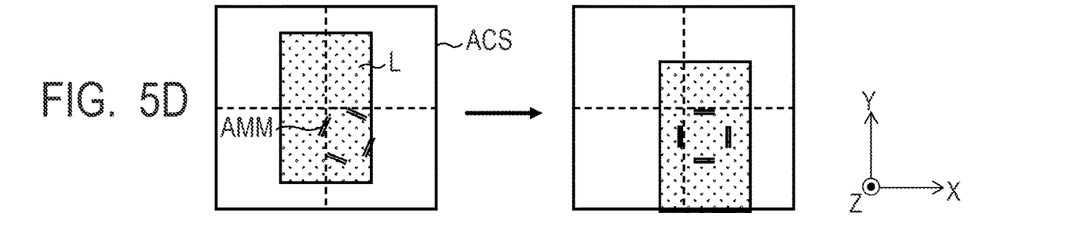
FIG. 5D is a diagram showing respective coordinate systems in the imprint apparatus according to the first embodiment.

FIGS. 5B to 5D show how the correction is made using the methods A, B and C in the step S454.

As shown in FIGS. 5B to 5D, it is assumed that the absolute coordinate system ACS and the coordinate system LCS coincide with each other, whereas the coordinate system MCS deviates from the absolute coordinate system ACS and the coordinate system LCS in an initial state of the imprint apparatus 100 according to the present embodiment.

When the correction is performed by the method A, the position of the spatial light modulating unit 191 is adjusted by the actuator 194 based on the measurement result of the alignment mark AMM in the step S451, as shown in FIG. 5B. That is, the actuator 194 serves as an adjusting unit in the method A.

Thereby, the relative difference between the coordinate system MCS and the coordinate system LCS is corrected by moving the light irradiation region L, namely the coordinate system LCS to bring the coordinate system LCS closer to the coordinate system MCS.

The number of control axes of the actuator 194 when the position of the spatial light modulating element 191 is corrected in the method A is preferably three or more, but may be two or less.

When the correction is performed by the method B, the light irradiation region L by the spatial light modulating unit 191 is adjusted based on the measurement result of the alignment mark AMM in the step S451, as shown in FIG. 5B.

Specifically, a surface direction of each of a plurality of micromirror elements forming a DMD is individually adjusted by correcting a control signal from the controller 170 which controls the spatial light modulating element 191 which is the DMD, in the method B. That is, the controller 170 serves as an adjustment unit in the method B.

Thereby, the relative difference between the coordinate system MCS and the coordinate system LCS is corrected by moving the light irradiation region L, namely the coordinate system LCS to bring the coordinate system LCS closer to the coordinate system MCS.

Unlike the method A, since the method B is not a correction for adjusting the position of the spatial light modulating element 191 by driving the actuator 194, namely a correction regarding a physical system, and the method B can be regarded as be the simplest method.

When the correction is performed by the method C, the position of the mold M is adjusted by moving the mold M by an actuator (not shown) based on the measurement result of the alignment mark AMM in the step S451, as shown in FIG. 5C. That is, the actuator for moving the mold M serves as an adjusting unit in the method C.

Thereby, the relative difference between the coordinate system MCS and the coordinate system LCS is corrected by moving the alignment mark AMM, namely the coordinate system MCS to bring the coordinate system MCS closer to the coordinate system LCS.

The number of control axes of the actuator when the position of the mold M is corrected in the method C is preferably three or more, but may be two or less.

Further, it is possible to perform the correction by moving both the coordinate system MCS and the coordinate system LCS by combining the methods A to C.

For example, as shown in FIG. 5D, the coordinate system MCS can be rotationally moved (namely, an uniaxial control), whereas the coordinate system LCS can be translationally moved (namely, biaxial control) to make both coordinate systems coincide with each other.

In this case, since it is possible to reduce the number of driving axes of each of the actuator 194 and the actuator (not shown) for moving respective coordinate systems, it is possible to improve a throughput when both coordinate systems are moved.

Further, since the number of control axes can be assigned to respective actuators, a degree of freedom for constructing a mechanism for moving respective coordinate systems can be improved.

In step S455, a determination is made as to an end of the correction of the coordinate system in the step S450.

Specifically, in the step S455, it is determined whether a series of processes including the steps S452 to S454 has been performed by a target number N.

If the number of loops i is smaller than the target number N (Yes in the step S455), the number of loops i is increased by 1 (step S456), and then the process returns to the step S452 to continue the series of processes including the steps S452 to S454.

On the other hand, when the number of loops i is equal to or greater than the target number N (No in the step S455), the series of processes including the steps S452 to S454 has been performed by the target number N, and thus the step S450 is ended.

The target number N for performing the series of processes including the steps S452 to S454 may be set in real time or may be set from an initial setting value by the controller 170.

As described above, the relative difference between the coordinate system MCS and the coordinate system LCS is corrected such that the coordinate system MCS and the coordinate system LCS coincide with each other by using at least one of the methods A, B and C in the step S450.

In other words, at least one of respective positions of the alignment mark AMM and the light irradiation region L in the XY plane parallel to the substrate surface is adjusted based on the measurement result of the position of the alignment mark AMM by the measurement unit 160.

Accordingly, in the imprint apparatus 100 according to the present embodiment, it is not necessary to obtain the deviation amount between the light irradiation region L and the alignment mark AMM by measuring the position of the light irradiation region L.

That is, it is possible to irradiate the most appropriate position on the predetermined shot region S of the substrate W with light by only measuring the position of the alignment mark AMM using the measurement unit 160.

In other words, it is not necessary to measure the position of the light irradiation region L by using another measurement unit or the like, so that the correction process of the relative difference between the coordinate system MCS and the coordinate system LCS can be performed in a short time, and the correction process of the deviation can be executed at a more desired timing in the imprint apparatus 100 according to present embodiment.

This makes it possible to perform a high accurate control of the light irradiation region L formed by the light supplying unit 190 with respect to the mold M and the imprint material R on the predetermined shot region S of the substrate W.

In the example described above, the deviation amount between the coordinate system LCS and the coordinate system MCS is calculated each time the imprint process is continuously performed on each of the plurality of shot regions S.

However, the deviation amount between the coordinate system $MCS_0$ measured in the previous imprint process and the coordinate system $MCS_1$ measured in the present imprint process may be calculated to perform the above-described correction based on the deviation amount for the second and subsequent imprint processes.

In this case, the measurement position of the coordinate system $MC_n$ when the imprint process for each shot region S is finished may be stored in a storage unit or the like included in the controller 170.

Returning to FIG. 4A, in step S460, the controller 170 controls the driving unit 122 to bring the mold M into contact with the imprint material R.

In the step S460, the controller 170 may raise the substrate W by controlling a driving mechanism (not shown) of the substrate stage 152 to bring the imprint material R into contact with the mold M.

At this time, the load in the contact may be controlled by using a load sensor included in the driving unit 122, for example, or may be controlled by referring to an operation amount of an actuator of the driving unit 122.

In step S470, an alignment is performed according to the die-by-die alignment method after the pattern formed in the pattern region of the mold M is filled with the imprint material R. In other words, respective positions of the pattern region of the mold M and the shot region S of the substrate W are aligned with each other.

Specifically, the alignment scope 161 pickups an image of the alignment mark AMM of the mold M and the alignment mark AMW on the predetermined shot region S of the substrate W after detecting them in the alignment.

Then, an image processing apparatus (not shown) measures the relative position between the alignment mark AMM and the alignment mark AMW from the image obtained by the image pickup.

Thereafter, the controller 170 calculates an error (specifically, coordinates, rotation, magnification, trapezoidal component, or the like) of respective shot shapes of the mold M and the substrate W based on the measurement result of the relative position to perform the alignment of each of the mold M and the substrate W so as to reduce the error.

In step S480, the controller 170 controls the curing unit 110 to irradiate the imprint material R with irradiation light via the mold M, thereby curing the imprint material R.

In step S490, the controller 170 controls the mold holding unit 120 or the substrate holding unit 150 to separate the mold M from the cured imprint material R, thereby forming a cured film on the substrate W.

In step S500, it is determined whether the imprint process has been finished for all of the shot regions S on the substrate W.

If the imprint process has not been finished for all of the shot regions S on the substrate W (No in the step S500), the process returns to the step S440 and the imprint process is continued.

On the other hand, if the imprint process has been finished for all of the shot regions S on the substrate W (Yes in the step S500), the process proceeds to step S510, and the controller 170 controls the conveying apparatus (not shown) to carry-out the substrate W, and then the process ends.

As described above, the imprint apparatus 100 according to the present embodiment controls at least one of respective positions of the alignment mark AMM and the light irradiation region L in the XY plane based on the measurement result of the alignment mark AMM of the mold M.

Thereby, the difference of the coordinate system LCS regarding the light irradiation region L with respect to the coordinate system MCS regarding the mold M can be corrected with high accuracy.

In the imprint apparatus 100 according to the present embodiment, the correction of the difference between the coordinate system LCS regarding the light irradiation region L in the spatial light modulating element 191 and the coordinate system MCS regarding the mold M has been described, but the present invention is not limited thereto.

That is, the above-described processes in the imprint apparatus 100 according to the present embodiment can be similarly applied to a correction of a difference between a coordinate system regarding a light irradiation region of irradiation light for curing the imprint material R by the curing unit 110 and the coordinate system MCS regarding the mold M.

In this case, it is possible to correct the difference between the coordinate system regarding the light irradiation region by the curing unit 110 and the coordinate system MCS regarding the mold M by adjusting a position of a masking blade for adjusting the light irradiation region by the curing unit 110 or adjusting the position of the mold M.

Further, the above-described processes can be similarly applied to a correction of a difference between the coordinate system MCS regarding the mold M and a coordinate system regarding a light irradiation region of irradiation light from a light source capable of selectively emitting one of the light for curing the imprint material R and the light for heating to deform the substrate W.

In the imprint apparatus 100 according to the present embodiment, the alignment in the imprint process is performed by using the measurement unit 160. However, the present invention is not limited thereto, the alignment may be performed by using the scope 180.

In this case, since the scope 180 can observe all of the alignment marks AMW in the predetermined shot region S at once, it is not necessary to drive the scope 180 for the alignment.

Second Embodiment

Figure 6A:
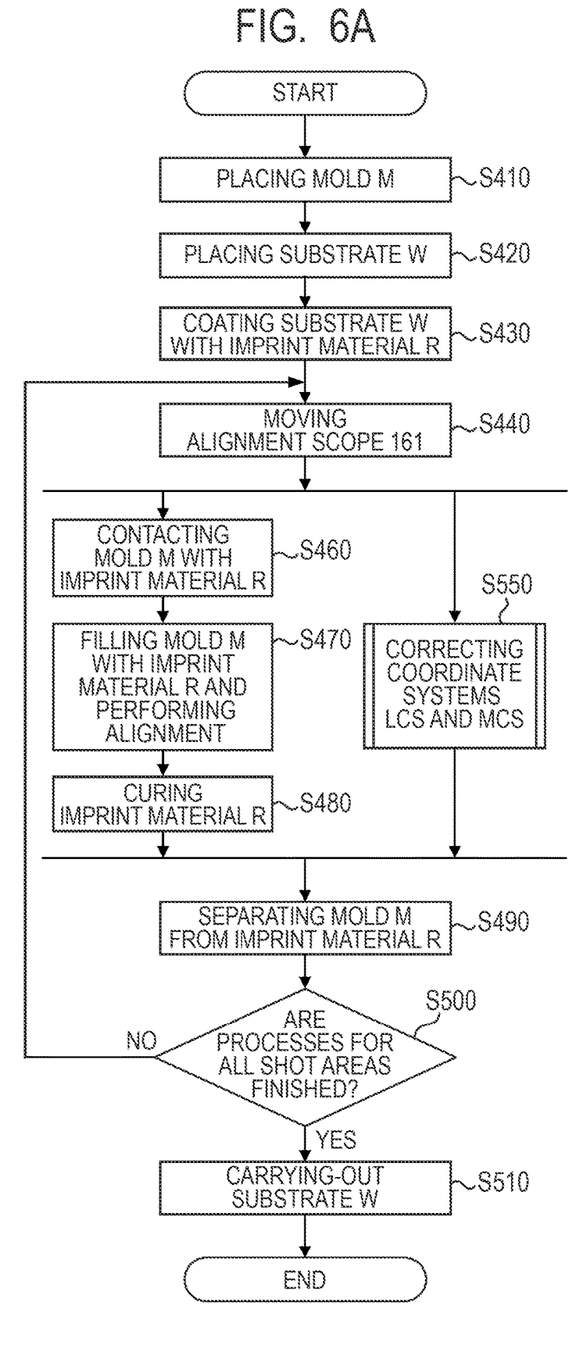
FIG. 6A is a flowchart showing an imprint process performed by an imprint apparatus according to a second embodiment of the present invention.

FIG. 6A is a flowchart showing an imprint process performed by an imprint apparatus according to a second embodiment of the present invention.

Note that the imprint apparatus according to the present embodiment has the same structure as the imprint apparatus 100 according to the first embodiment, so that the same members are denoted by the same reference numerals, and a description thereof will be omitted.

In the imprint apparatus 100 according to the first embodiment, the imprint operation is performed in the steps S460 to S480 after correcting the difference between the coordinate system LCS regarding the light irradiation region L and the coordinate system MCS regarding the mold M in the step S450.

On the other hand, in the imprint apparatus 100 according to the first embodiment, the mold M held by the mold chuck 121 may be displaced during the imprint operation, especially, when the mold M is brought into contact with the imprint material R in the step S460.

In this case, since the light irradiation region L cannot follow such displacement, a difference may occur between both of the coordinate systems again.

In view of the above, the imprint apparatus according to the present embodiment is configured to perform an imprint process in consideration of the reoccurrence of such difference as described below.

In the imprint process by the imprint apparatus according to the present embodiment, first, the steps S410 to S440 are performed similarly to the imprint apparatus 100 according to the first embodiment.

Then, in the imprint apparatus according to the present embodiment, step S550 for correcting the coordinate systems and a series of processes for curing the imprint material R consisting of the steps S460 to S480 are performed in parallel with each other, unlike the imprint apparatus 100 according to the first embodiment.

Figure 6B:
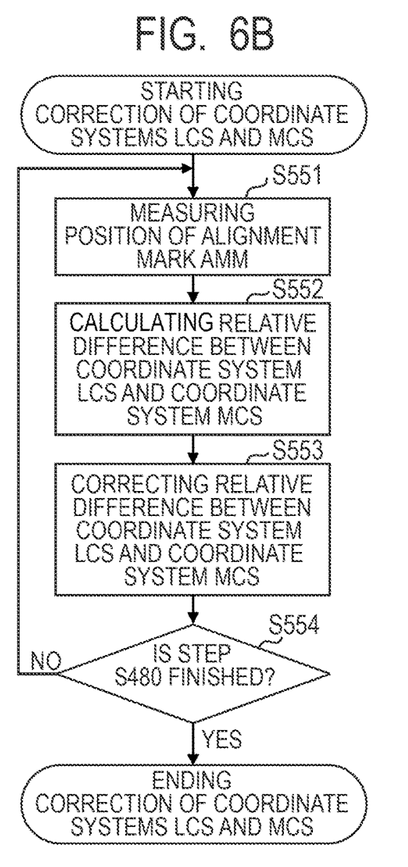
FIG. 6B is a flowchart showing the imprint process performed by the imprint apparatus according to the second embodiment.

FIG. 6B is a flowchart showing the process in the step S550.

As shown in FIG. 6B, the step S550 includes steps S551 to S554.

In step S551, the position of the alignment mark AMM is measured by the alignment scope 161.

In step S552, a relative difference between the coordinate system MCS and the coordinate system LCS is calculated based on the measurement result of the position of the alignment mark AMM in the step S551.

In step S553, the relative difference between the coordinate system MCS and the coordinate system LCS calculated in the step S552 is corrected.

Note that a specific process in the step S553 is identical to the process in the step S454 in the imprint apparatus 100 according to the first embodiment, so that a description thereof will be omitted.

In step S554, a determination is made as to an end of the correction of the coordinate systems in the step S550.

Specifically, in the step S554, it is determined whether the curing of the imprint material R in the step S480 has been finished.

If the process in the step S480 is not finished (No in the step S554), the process returns to the step S551, and a series of processes including the steps S551 to S553 is continued.

On the other hand, if the process in the step S480 has been finished (Yes in the step S554), the step S550 is ended.

When the relative difference between the coordinate system MCS and the coordinate system LCS is corrected in the step S553, it is necessary to consider that the filling of the imprint material R and the alignment are performed in the step S470.

That is, in the step S553, it is not preferred to perform the method C of driving the coordinate system MCS, namely driving the mold M.

Further, in this case, the measurement of the alignment mark AMM by the alignment scope 161 in the step S470 and the measurement of the alignment mark AMM by the alignment scope 161 in the step S551 are performed in parallel.

Accordingly, the measurement of the alignment mark AMM may be performed independently in each of the step S470 and the step S551, or may be performed only once to be shared in the step S470 and the step S551.

In the imprint apparatus according to the present embodiment, the steps S490 to S510 are performed similarly to the imprint apparatus 100 according to the first embodiment after the step S480 is finished and the step S550 is finished.

As described above, the imprint apparatus according to this embodiment controls at least one of respective positions of the alignment mark AMM and the light irradiation region L in the XY plane based on the measurement result of the alignment mark AMM of the mold M with performing the imprint operation.

Thereby, it is possible to correct the difference of the coordinate system LCS regarding the light irradiation region L with respect to the coordinate system MCS regarding the mold M with high accuracy with also considering the difference that may occur during performing the imprint operation.

Further, a throughput in the imprint process can be improved by performing the step S550 for correcting the coordinate systems and the imprint operation including the steps S460 to S480 in parallel with each other.

According to the present invention, an imprint apparatus can be provided which is capable of adjusting a position of an irradiation region of light with which a substrate is irradiated with suppressing a decrease in throughput.

Article Manufacturing Method

A manufacturing method of a device including a semiconductor integrated circuit element or a liquid crystal display element or the like as an article, for example, includes a step of forming a pattern on a substrate, such as a wafer, a glass plate or a film-like substrate by using the imprint apparatus according to the present invention described above.

Further, the manufacturing method includes a step of etching the substrate on which the pattern is formed.

When another article, such as a patterned medium (a recording medium) or an optical element is manufactured, the manufacturing method may include another step of processing the substrate on which the pattern is formed instead of etching.

The manufacturing method of an article according to the present invention is advantageous in at least one of performance, quality, productivity and production cost of the article as compared with a conventional method.

Although preferred embodiments have been described above, the present invention is not limited to these embodiments, and various modifications and changes can be made within the scope of the gist of the present invention.

The disclosure of the present invention includes the following Structures and Methods:

(Structure 1) An imprint apparatus for forming a pattern by curing a resin in a state where a pattern region in a mold is brought into contact with the resin on a shot region in a substrate, wherein the imprint apparatus comprises an element configured to adjust an irradiation region of light from a light source with which the substrate is irradiated, a measurement unit configured to measure a position of a mark formed in the mold, and a controller configured to control a position of the irradiation region with respect to the position of the mark in a plane parallel to a surface of the substrate, based on a measurement result of the position of the mark by the measurement unit.

(Structure 2) The imprint apparatus according to Structure 1, wherein the controller is configured to control the position of the irradiation region with respect to the position of the mark without using the position of the irradiation region.

(Structure 3) The imprint apparatus according to Structure 1 or 2, wherein the element is a spatial modulating element configured to adjust the irradiation region of the light from the light source.

(Structure 4) The imprint apparatus according to any one of Structures 1 to 3, wherein the controller is configured to control the position of the irradiation region with respect to the position of the mark by adjusting a position of the element.

(Structure 5) The imprint apparatus according to any one of Structures 1 to 4, wherein the element is a digital micromirror device formed by a plurality of micromirror elements, and wherein the controller is configured to control the position of the irradiation region with respect to the position of the mark by adjusting a surface direction of at least one of the plurality of micromirror elements.

(Structure 6) The imprint apparatus according to any one of Structures 1 to 5, wherein the controller is configured to control the position of the irradiation region with respect to the position of the mark by adjusting a position of the mold.

(Structure 7) The imprint apparatus according to any one of Structures 1 to 6, wherein the controller is configured to perform a control to bring the pattern region into contact with the resin on the shot region after performing the control of the position of the irradiation region with respect to the position of the mark.

(Structure 8) The imprint apparatus according to any one of Structures 1 to 6, wherein the controller is configured to perform a control to bring the pattern region into contact with the resin on the shot region or a control to align positions of the pattern region and the shot region with each other with performing the control of the position of the irradiation region with respect to the position of the mark.

(Structure 9) The imprint apparatus according to any one of Structures 1 to 8, wherein the light emitted from the light source heats the substrate to deform the shot region without curing the resin.

(Structure 10) The imprint apparatus according to any one of Structures 1 to 8, wherein the light emitted from the light source cures the resin.

(Structure 11) The imprint apparatus according to any one of Structures 1 to 8, wherein the light source is configured to selectively emit one of light for heating the substrate to deform the shot region without curing the resin and light for curing the resin.

(Method 1) An article manufacturing method for manufacturing an article from a processed substrate, wherein the article manufacturing method comprises forming a pattern by curing a resin in a state in which a pattern region in a mold is brought into contact with the resin on a shot region in a substrate using the imprint apparatus according to any one of Structures 1 to 11, and processing the substrate on which the pattern is formed.

(Method 2) An alignment method in an imprint apparatus for forming a pattern by curing a resin in a state in which a pattern region in a mold is brought into contact with the resin on a shot region in a substrate, including an element configured to adjust an irradiation region of light from a light source with which the substrate is irradiated, wherein the alignment method comprises measuring a position of a mark formed in the mold, and controlling a position of the irradiation region with respect to the position of the mark in a plane parallel to a surface of the substrate, based on a measurement result of the position of the mark in the measuring.

(Method 3) The alignment method according to Method 2, wherein the controlling includes controlling the position of the irradiation region with respect to the position of the mark without using the position of the irradiation region.

(Method 4) The alignment method according to Method 2 or 3, wherein the element is a spatial modulating element configured to adjust the irradiation region of the light from the light source.

(Method 5) The alignment method according to any one of Methods 2 to 4, wherein the controlling includes controlling the position of the irradiation region with respect to the position of the mark by adjusting a position of the element.

(Method 6) The alignment method according to any one of Methods 2 to 5, wherein the element is a digital micromirror device formed by a plurality of micromirror elements, and wherein the controlling includes controlling the position of the irradiation region with respect to the position of the mark by adjusting a surface direction of at least one of the plurality of micromirror elements.

(Method 7) The alignment method according to any one of Methods 2 to 6, wherein the controlling includes controlling the position of the irradiation region with respect to the position of the mark by adjusting a position of the mold.

(Method 8) The alignment method according to any one of Methods 2 to 7, wherein bringing the pattern region into contact with the resin on the shot region is performed after the controlling is performed.

(Method 9) The alignment method according to any one of Methods 2 to 7, wherein bringing the pattern region into contact with the resin on the shot region is performed with performing the controlling.

(Method 10) The alignment method according to any one of Methods 2 to 9, wherein the light emitted from the light source heats the substrate to deform the shot region without curing the resin.

(Method 11) The alignment method according to any one of Methods 2 to 9, wherein the light emitted from the light source cures the resin.

(Method 12) The alignment method according to any one of Methods 2 to 9, wherein the light source is configured to selectively emit one of light for heating the substrate to deform the shot region without curing the resin and light for curing the resin.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-136374, filed Aug. 24, 2021 and Japanese Patent Application No. 2022-083627, filed May 23, 2022, which are hereby incorporated by reference herein in their entirety.

What is claimed is:

1. An imprint apparatus for forming a pattern by curing a resin in a state where a pattern region in a mold is brought into contact with the resin on a shot region in a substrate, the imprint apparatus comprising:
    an element configured to adjust an irradiation region of light from a light source with which the substrate is irradiated;
    a measurement unit configured to measure a position of a mark formed in the mold; and
    a controller configured to:
        determine a deviation between a light coordinate system of the irradiation region of light and a mask coordinate system of the mold based on a measurement result of the position of only the mark formed in the mold by the measurement unit; and
        correct the deviation by performing a predetermined correction on at least one of the position of the irradiation region of light or the position of the mark formed in the mold to align the light coordinate system with the mask coordinate system, based on the determined deviation.

2. The imprint apparatus according to claim 1, wherein the element is a spatial modulating element configured to adjust the irradiation region of the light from the light source.

3. The imprint apparatus according to claim 1, wherein the controller is configured to correct the position of the irradiation region by adjusting a position of the element.

4. The imprint apparatus according to claim 1,
wherein the element is a digital micromirror device formed by a plurality of micromirror elements, and
wherein the controller is configured to correct the position of the irradiation region by adjusting a surface direction of at least one of the plurality of micromirror elements.

5. The imprint apparatus according to claim 1, wherein the controller is configured to perform a control to bring the pattern region into contact with the resin on the shot region after correcting the deviation.

6. The imprint apparatus according to claim 1, wherein the controller is configured to perform a control to bring the pattern region into contact with the resin on the shot region or a control to align positions of the pattern region and the shot region with each other with correcting the deviation.

7. The imprint apparatus according to claim 1, wherein the light emitted from the light source heats the substrate to deform the shot region without curing the resin.

8. The imprint apparatus according to claim 1, wherein the light emitted from the light source cures the resin.

9. The imprint apparatus according to claim 1, wherein the light source is configured to selectively emit one of light for heating the substrate to deform the shot region without curing the resin and light for curing the resin.

10. An article manufacturing method for manufacturing an article from a processed substrate, the article manufacturing method comprising:
forming a pattern by curing a resin in a state in which a pattern region in a mold is brought into contact with the resin on a shot region in a substrate using the imprint apparatus according to claim 1; and
processing the substrate on which the pattern is formed.

11. An alignment method in an imprint apparatus for forming a pattern by curing a resin in a state in which a pattern region in a mold is brought into contact with the resin on a shot region in a substrate, the imprint apparatus including an element configured to adjust an irradiation region of light from a light source with which the substrate is irradiated, the alignment method comprising:
measuring a position of a mark formed in the mold;
determining a deviation between a light coordinate system of the irradiation region of light and a mask coordinate system of the mold based on a measurement result of the position of only the mark formed in the mold; and
correcting the deviation by performing a predetermined correction on at least one of the position of the irradiation region of light or the position of the mark formed in the mold to align the light coordinate system with the mask coordinate system, based on the determined deviation.

12. The alignment method according to claim 11, wherein the element is a spatial modulating element configured to adjust the irradiation region of the light from the light source.

13. The alignment method according to claim 11, further including correcting the position of the irradiation region by adjusting a position of the element.

14. The alignment method according to claim 11,
wherein the element is a digital micromirror device formed by a plurality of micromirror elements, and
wherein the method further includes correcting the position of the irradiation region by adjusting a surface direction of at least one of the plurality of micromirror elements.

15. The alignment method according to claim 11, wherein bringing the pattern region into contact with the resin on the shot region is performed after the correcting of the deviation is performed.

16. The alignment method according to claim 11, wherein bringing the pattern region into contact with the resin on the shot region is performed with correcting the deviation.

* * * * *